(12) United States Patent
Cheng

(10) Patent No.: US 12,066,256 B2
(45) Date of Patent: Aug. 20, 2024

(54) ULTRA-THIN HEAT PIPE AND MANUFACTURING METHOD OF THE SAME

(71) Applicant: COOLER MASTER CO., LTD., New Taipei (TW)

(72) Inventor: Jen-Chih Cheng, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 121 days.

(21) Appl. No.: 16/845,663

(22) Filed: Apr. 10, 2020

(65) Prior Publication Data
US 2020/0326133 A1    Oct. 15, 2020

Related U.S. Application Data

(60) Provisional application No. 62/832,664, filed on Apr. 11, 2019.

(51) Int. Cl.
*B23P 15/26* (2006.01)
*F28D 15/04* (2006.01)

(52) U.S. Cl.
CPC .............. *F28D 15/04* (2013.01); *B23P 15/26* (2013.01); *B23P 2700/09* (2013.01)

(58) Field of Classification Search
CPC ..................................................... F28D 15/04
See application file for complete search history.

(56) References Cited

U.S. PATENT DOCUMENTS

| | | | | |
|---|---|---|---|---|
| 6,148,906 A * | 11/2000 | Li | ............ | F28D 15/0233 |
| | | | | 165/104.26 |
| 7,543,630 B2 * | 6/2009 | Lai | ............ | F28D 15/0233 |
| | | | | 165/104.26 |
| 9,291,398 B2 * | 3/2016 | Yang | ............ | H01L 23/427 |
| 10,145,619 B2 * | 12/2018 | Huang | ............ | F28D 15/025 |
| 11,058,031 B2 * | 7/2021 | Numoto | ............ | F28D 15/04 |
| 11,313,627 B2 * | 4/2022 | Inagaki | ............ | F28F 21/08 |
| 2001/0047859 A1 * | 12/2001 | Ishida | ............ | F28D 15/0283 |
| | | | | 165/104.14 |

(Continued)

FOREIGN PATENT DOCUMENTS

WO    WO-2020255513 A1 * 12/2020   ......... F28D 15/0233

OTHER PUBLICATIONS

WO2020255513A1 mt (Year: 2020).*

*Primary Examiner* — Gordon A Jones
(74) *Attorney, Agent, or Firm* — Merchant & Gould

(57) ABSTRACT

A heat dissipating device that includes a first plate and a second plate opposite the first plate and connected to the first plate by two opposite sidewalls. The first plate and the second plate are connected to each other at longitudinally opposite ends thereof, longitudinally extending ends of the first plate and the second plate are connected to each other by sidewalls, and the first plate, the second plate and the sidewalls enclosing an internal space of the heat dissipating device. The heat dissipating device also includes a first wick structure disposed in the internal space and contacting inner surfaces of at least one of the first plate and the second plate. The first wick structure extends longitudinally between the longitudinally opposite ends of the first plate and the second plate, and the first wick structure at least partially defines a first vapor flow channel of the heat dissipating device.

15 Claims, 14 Drawing Sheets

(56) References Cited

U.S. PATENT DOCUMENTS

| | | | | |
|---|---|---|---|---|
| 2009/0084526 A1* | 4/2009 | Chang | .................... | F28D 15/046 |
| | | | | 165/104.26 |
| 2011/0174464 A1* | 7/2011 | Liu | ....................... | F28D 15/046 |
| | | | | 165/104.26 |
| 2011/0174465 A1* | 7/2011 | Liu | ....................... | F28D 15/046 |
| | | | | 165/104.26 |
| 2011/0174466 A1* | 7/2011 | Liu | ....................... | H01L 23/427 |
| | | | | 165/104.26 |
| 2011/0253345 A1* | 10/2011 | Ryoson | .................. | B23K 20/16 |
| | | | | 165/104.26 |
| 2012/0118537 A1* | 5/2012 | Kameoka | .............. | F28D 15/046 |
| | | | | 29/890.032 |
| 2013/0160977 A1* | 6/2013 | Fan | ..................... | F28D 15/0233 |
| | | | | 165/104.26 |
| 2013/0213610 A1* | 8/2013 | Wu | ....................... | F28D 15/046 |
| | | | | 165/104.26 |
| 2014/0102671 A1* | 4/2014 | Dai | ..................... | F28D 15/0233 |
| | | | | 165/104.26 |
| 2014/0352925 A1* | 12/2014 | Yu | ....................... | F28D 15/0233 |
| | | | | 165/104.26 |
| 2017/0122672 A1* | 5/2017 | Lin | ......................... | B23K 35/00 |
| 2021/0180876 A1* | 6/2021 | Kojima | ................ | H01L 23/427 |

\* cited by examiner

ULTRA-THIN HEAT PIPE AND MANUFACTURING METHOD OF THE SAME

CROSS-REFERENCE TO RELATED APPLICATIONS

This non-provisional application claims priority under 35 U.S.C. § 120 to U.S. provisional application No. 62/832,664 filed Apr. 11, 2019, the entire contents of which are hereby incorporated by reference.

BACKGROUND

During operation of electronic devices, the heat generated by the processors must be dissipated quickly and efficiently to keep operating temperatures within manufacturer recommended ranges. As these electronic devices increase in functionality and applicability so does operating speed of the processors used therein. With each new generation of electronic devices being thinner and more compact, thermal management of these devices becomes challenging as spacing between the different heat sources in the electronic devices is reduced.

Heat pipes are used to dissipate heat. In general, planar heat pipes are formed by flattening heat pipes to around 30% to 60% of their original diameter. Planar heat pipes are vacuum containers that carry heat from a heat source by evaporation of a working fluid which is spread by a vapor flow filling the vacuum, increasing the thermally connected surface area. The vapor flow eventually condenses over cooler surfaces, and, as a result, the heat is uniformly distributed from an evaporation surface (heat source interface) to a condensation surface (larger cooling surface area). Thereafter, condensed fluid flows back to the evaporation surface. A wick structure, such as a sintered powdered wick, is used to facilitate the flow of the condensed fluid by capillary force back to the evaporation surface, keeping the evaporation surface wet for large heat fluxes.

The thermal performance of planar heat pipes is dependent on the effectiveness of the heat pipes to dissipate heat via the phase change (liquid-vapor-liquid) mechanism. The capillary force generated in the wick structure must overcome the liquid pressure drop in the wick and vapor pressure drop in the heat pipe. The capillary force generated is reduced when the vapor chambers are thin, as the liquid pressure drop and vapor pressure drop are higher when spacing is reduced. A sintered powdered wick can provide high capillary pressure, however it also has a high liquid pressure drop, leading to an adverse effect on the thermal performance of planar heat pipes. Furthermore, when the heat pipes are flattened, the structural integrity of the flattened structure is compromised. In addition, the flattened structure decreases thermal performance.

Figure 1A:
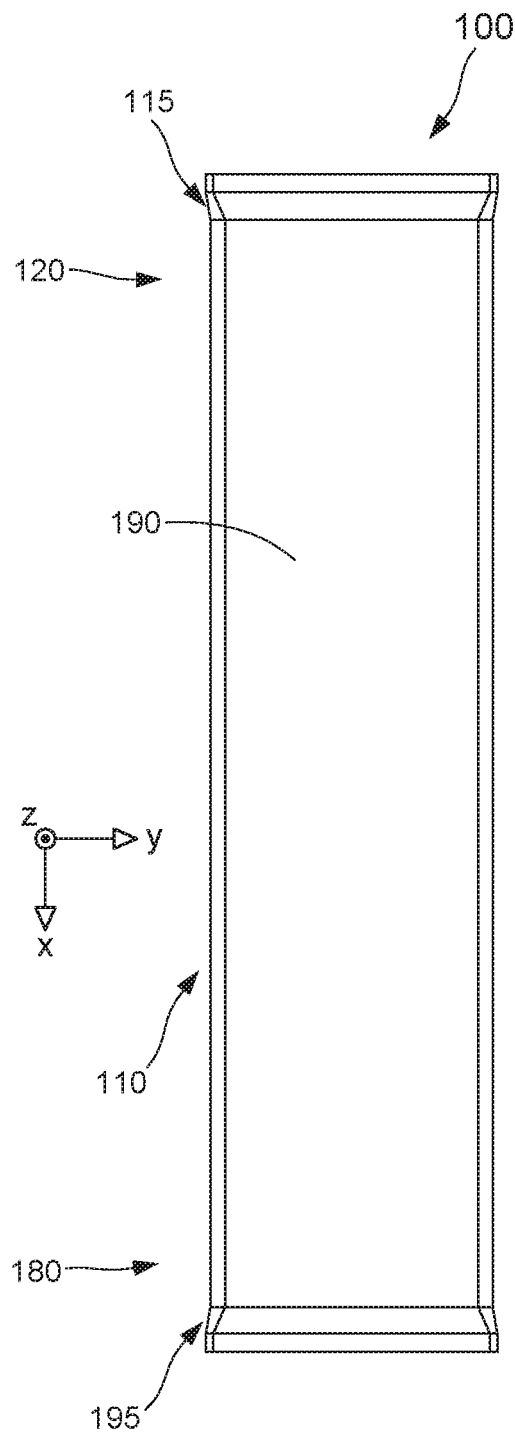
FIG. 1A is a plan view of an ultra-thin heat pipe, according to embodiments.

It should be understood that the drawings are not to scale and that the disclosed embodiments are sometimes illustrated diagrammatically and in partial views. In certain instances, details that are not necessary for an understanding of the disclosed method and apparatus, or that would render other details difficult to perceive may have been omitted. It should be understood that the present application is not limited to the particular embodiments illustrated herein.

DETAILED DESCRIPTION

The present application is now described more fully hereinafter with reference to the accompanying drawings illustrating various example embodiments. However, example embodiments can be embodied in many different forms and should not be construed as being limited to those set forth herein; rather these embodiments are provided so that this disclosure will be thorough and complete and will fully convey the scope of the disclosure to those of ordinary skill in the relevant art.

Like numbers refer to like elements throughout. In the figures, the thickness of certain lines, layers, components, elements or features can be exaggerated for clarity. Where used, broken lines illustrate optional features or operations unless specified otherwise.

The terminology used herein is for the function of describing particular embodiments only and is not intended to be limiting in any sense. As used herein, the singular forms "a," "an" and "the" are intended to include plural forms as well, unless the context clearly indicates otherwise. It will be further understood that the terms "comprises" or "comprising," as used herein, encompass the notions of "including" and "having" and specify the presence of stated features, integers, steps, operations, elements components and/or groups or combinations thereof, but do not preclude the presence or addition of one or more other features, integers, steps, operations, elements, components and/or groups or combinations thereof.

The use of "for example" or "such as" to list illustrative examples does not limit to only the listed examples. Thus, "for example" or "such as" means "for example, but not limited to" or "such as, but not limited to" and encompasses other similar or equivalent examples.

As used herein, the term "and/or" includes any and all possible combinations or one or more of the associated listed items, as well as the lack of combinations when interpreted in the alternative ("or").

As used herein, the terms "embodiment" or "present embodiment" are non-limiting terms and not intended to refer to any single aspect of the particular embodiment but encompass all possible aspects as described in the specification and the claims.

Unless otherwise defined, all terms (including technical and scientific terms) used herein have the same meaning as understood by one of ordinary skill in the art. It will be further understood that terms, such as those defined in knowingly used dictionaries, should be interpreted as having a meaning that is consistent with their meaning in the context of the specification and claims and should not be interpreted in an idealized or overly formal sense unless expressly so defined herein. Detailed description of well-known functions or constructions is omitted for sake of brevity and/or clarity.

It will be understood that when an element is referred to as being "on," "assembled" to, "connected" to, "coupled" with, "contacting," etc., another element, it can be directly on, assembled to, connected to, coupled with and/or contacting the other element or intervening elements can also be present. In contrast, when an element is referred to as being, for example, "directly on," "directly assembled" to, "directly connected" to, "directly coupled" with or "directly contacting" another element, there are no intervening elements present. It will also be appreciated by those of ordinary skill in the relevant art that references to a structure or feature that is disposed "adjacent" another feature can have portions that overlap or underlie the adjacent feature.

Spatially relative terms, such as "under," "below," "lower," "over," "upper" and the like, can be used herein for ease of description to describe an element's or feature's relationship to another element's or feature's as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" can encompass both an orientation of over and under. The device can otherwise be oriented (rotated 90 degrees or at other orientations) and the spatially relative descriptors used herein interpreted accordingly. Similarly, the terms "upwardly," "downwardly," "vertical," "horizontal" and the like are used herein for the function of explanation only, unless specifically indicated otherwise.

It will be understood that, although the terms first, second, etc., can be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present application. The sequence of operations (or steps) is not limited to the order presented in the claims or figures unless specifically indicated otherwise.

Embodiments of the present disclosure relate generally to field of heat transfer and, more particularly, to heat dissipation devices and method of manufacturing the same. The heat dissipation devices include a working fluid under vacuum.

For the purposes of discussion, embodiments are directed to heat dissipation devices including ultra-thin heat pipes. However, embodiments are equally applicable to other types of heat dissipation devices without departing from the scope of the disclosure. In some embodiments, an ultra-thin heat pipe includes an evaporator section, a condenser section, and first and second vapor flow channels extending between the evaporator section and the condenser section. The ultra-thin heat pipe further includes first, second, and third wick structures. The first wick structure longitudinally contacts a first inner surface, a second inner surface, and a first sidewall inner surface of the ultra-thin heat pipe. The third wick structure longitudinally contacts the first and second inner surfaces, and a second sidewall inner surface of the ultra-thin heat pipe opposite the first sidewall inner surface. The second wick structure contacts the first and second inner surfaces and is between the first vapor flow channel and second vapor flow channel.

The first and second vapor flow channels provide the required vapor pressure drop, and the first, second, and third wick structures provide the required capillary pressure with minimal liquid pressure drop. The pressure drops due to the arrangement of the first and second vapor flow channels and the first, second, and third wick structures provide a capillary force that is generated in the first, second, and third wick structures, that is equal to or greater than the liquid pressure drop in the wick structures and vapor pressure drop in the ultra-thin heat pipe. The first, second, and third wick structures provide support, and reduce deformation of the ultra-thin heat pipe.

Figure 1B:
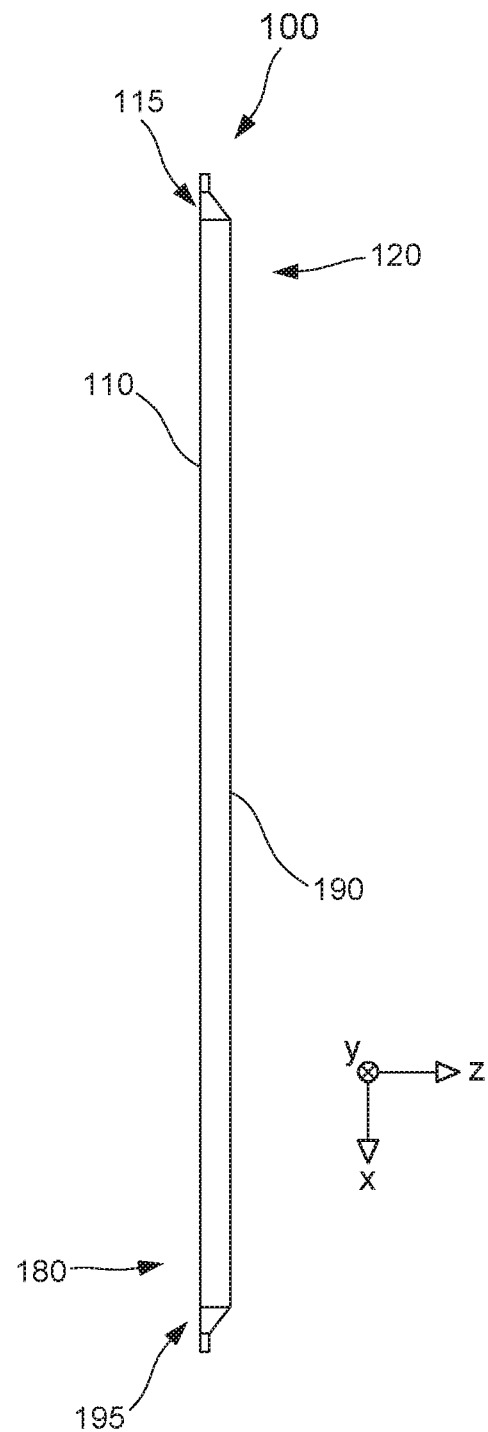
FIG. 1B is a side view of the ultra-thin heat pipe, according to embodiments.
Figure 1C:
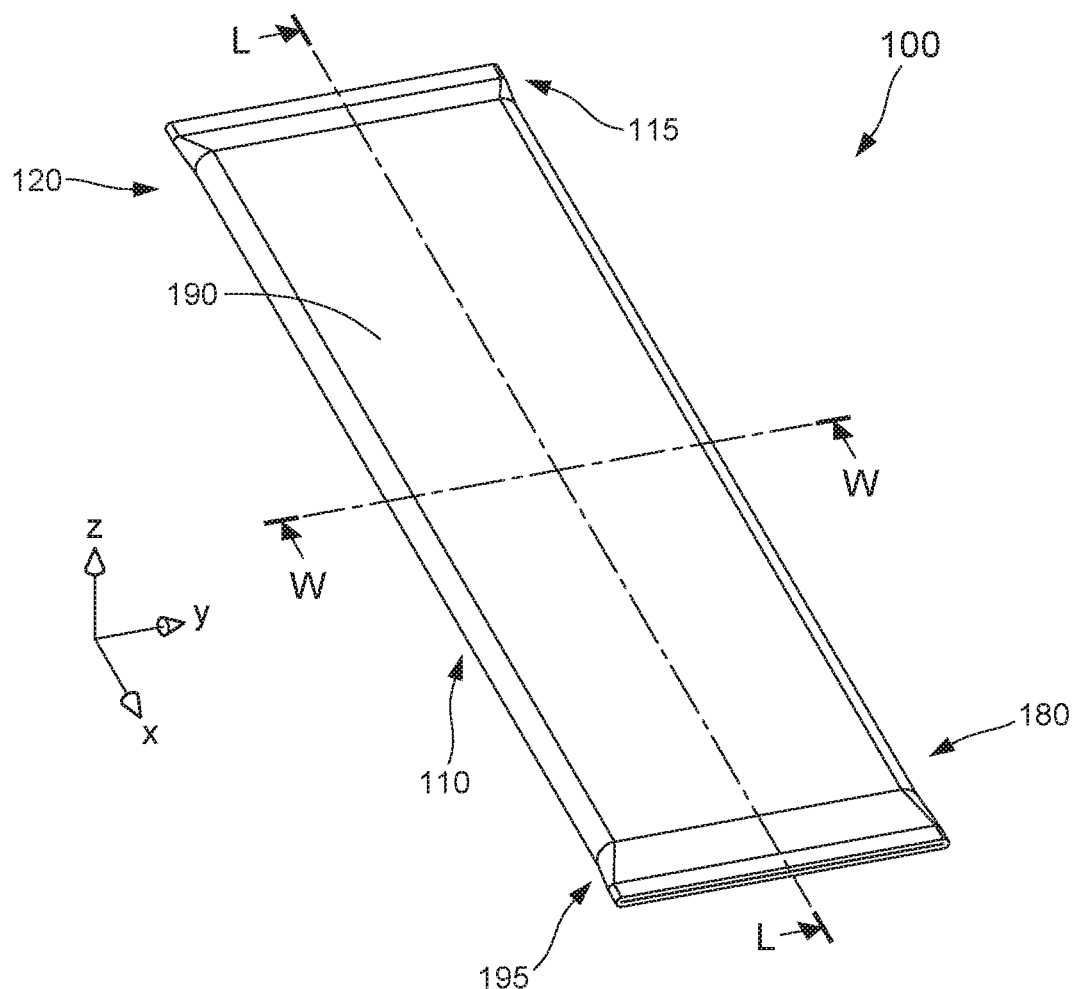
FIG. 1C is a perspective view of the ultra-thin heat pipe, according to embodiments.
Figure 1D:
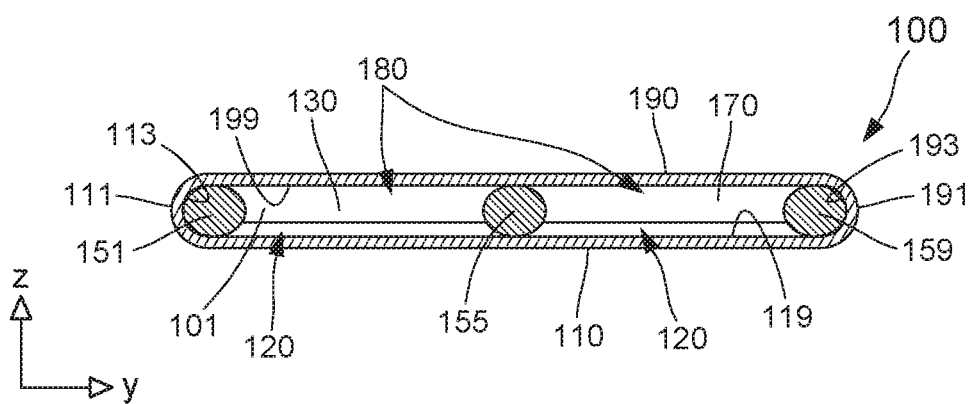
FIG. 1D is a cross-sectional view of the ultra-thin heat pipe taken along line W-W in FIG. 1C, according to embodiments.

FIG. 1A is a plan view of an ultra-thin heat pipe 100, according to embodiments. FIG. 1B is a side view of the ultra-thin heat pipe 100, according to embodiments. FIG. 1C is a perspective view of the ultra-thin heat pipe 100, according to embodiments. FIG. 1D is a cross-sectional view of the ultra-thin heat pipe 100 taken along line W-W in FIG. 1C, according to embodiments. As shown in FIGS. 1A to 1D, the ultra-thin heat pipe 100 includes a first plate 110 and a second plate 190 connected to each other at a first end (also referred to as a closing end) 115 and a second end (also referred to as a working section end) 195 longitudinally (X direction) opposite the first end 115. The first plate 110 is opposite the second plate 190 and the separation therebetween (Z direction) defines the thickness of the ultra-thin heat pipe 100.

The longitudinally extending ends of the first plate 110 and the second plate 190 are connected to each other by a first sidewall 111 and a second sidewall 191 opposite each other. The separation between the first sidewall 111 and the second sidewall 191 defines the width (Y direction) of the ultra-thin heat pipe 100. The first plate 110, the second plate 190, the closing end 115, the working section end 195, the first sidewall 111, and the second sidewall 191 cooperatively define an internal space 101 of the ultra-thin heat pipe 100. The first plate 110, the second plate 190, the first sidewall 111, and the second sidewall 191 are portions of a unitary structure that forms the ultra-thin heat pipe.

The first plate 110 has a first inner surface 119 that faces (or is otherwise exposed to) the internal space 101. The second plate 110 has a second inner surface 199 that faces (or is otherwise exposed to) the internal space 101. The first sidewall 111 has a first sidewall inner surface 113 that faces the internal space 101. The second sidewall 191 has a second sidewall inner surface 193 that faces the internal space 101.

The ultra-thin heat pipe 100 further includes a first wick structure 151, a second wick structure 155, and a third wick structure 159. The first wick structure 151 extends longitudinally between the closing end 115 and the working section end 195. The first wick structure 151 contacts the first inner surface 119, the second inner surface 199, and the first sidewall inner surface 113. The third wick structure 159 extends longitudinally between the closing end 115 and the working section end 195. The third wick structure 159 contacts the first inner surface 119, the second inner surface 199, and the second sidewall inner surface 193. The second wick structure 155 extends longitudinally between the closing end 115 and the working section end 195. The second wick structure 155 contacts the first inner surface 119 and the second inner surface 199, and is located between first wick structure 151 and the third wick structure 159. The first wick structure 151, the second wick structure 155, and the third wick structure 159 support the first plate 110 and the second plate 190.

The first wick structure 151, the second wick structure 155, and the third wick structure 159 separate the internal space 101 into a first vapor flow channel 130 and a second vapor flow channel 170. The first vapor flow channel 130 is between the first wick structure 151 and the second wick structure 155. The second vapor flow channel 170 is between the second wick structure 155 and the third wick structure 159. The ultra-thin heat pipe 100 includes an evaporator section 120 and a condenser section 180. The first vapor flow channel 130 and the second vapor flow channel 170 extend between the evaporator section 120 and the condenser section 180.

In some embodiments, and as illustrated, the evaporator section 120 and the condenser section 180 are at longitudinally opposite ends of the ultra-thin heat pipe 100. For example, the evaporator section 120 is at or adjacent the closing end 115 and the condenser section 180 is at or adjacent the working section end 195. However, embodiments are not limited in this regard. In other embodiments, the evaporator section 120 is at or adjacent the working section end 195 and the condenser section 180 is at or adjacent the closing end 115. In some other embodiments, the length of the evaporator section 120 is one half of the length (X direction) of the ultra-thin heat pipe 100 and the length of the condenser section 180 is the other half of the length of the ultra-thin heat pipe 100.

A side or end of the ultra-thin heat pipe that includes a heat source (from which heat is to be dissipated) functions as the evaporator section, and a side or end of the ultra-thin heat pipe where the heat source is absent functions as the condenser section, and the first vapor flow channel and the second vapor flow channel extend between the evaporator section and the condenser section.

In some embodiments, the ultra-thin heat pipe is constructed from a single piece of conductive material, such as copper. However, embodiments are not limited in this regard. Those of ordinary skill in the art can readily appreciate that in some other embodiments, conductive materials other than copper can be used depending on application and design requirements. Any desired conductive material can be used, as long as the capillary force generated in the first, second, and third wick structures is equal to or greater than the liquid pressure drop in the wick structures and vapor pressure drop in the ultra-thin heat pipe.

In some embodiments, the ultra-thin heat pipe has a rectangular shape, however, embodiments are not limited in this regard. Those of ordinary skill in the art can readily appreciate that in other embodiments, the ultra-thin heat pipe is includes a bend, or a curve or has a non-rectangular or any desired shape. The ultra-thin heat pipe can have any desired shape as long as the capillary force generated in the first, second, and third wick structures is equal to or greater than the liquid pressure drop in the wick structures and vapor pressure drop in the ultra-thin heat pipe.

In some embodiments, the first, second, and third wick structures are manufactured using a single conductive material, such as a copper. However, embodiments are not limited in this regard. In other embodiments, non-conductive materials, such as polymer wire, can be used to manufacture fiber wick structures. In still other embodiments, a wick structure can be manufactured using a combination of conductive and non-conductive materials. Embodiments of ultra-thin heat pipe disclosed herein include three wick structures 151, 155, and 159, and two vapor flow channels. The wick structures 151, 155, and 159 include a same conductive material. However, other embodiments can include two wick structures or more than three wick structures. One or more of the wick structures are constructed from more than one conductive material or are manufactured using a combination of conductive and non-conductive materials. Additionally, the ultra-thin heat pipe can include more than two vapor flow channels.

The ultra-thin heat pipe can include any number of wick structures longitudinally disposed in the ultra-thin heat pipe with at least one wick structure being located contacting each sidewall inner surface and at least one wick structure located therebetween. The wick structures provide support to the ultra-thin heat pipe and minimize deformation of the plates (e.g., the first and second plates) of the ultra-thin heat pipe. The wick structures provide a capillary force that is equal to or greater than the liquid pressure drop in the wick structures and vapor pressure drop in the ultra-thin heat pipe. In some embodiments, one or more of the first, second, and third wick structures are made of two parts that are separated by a space (gap). The wick structure working fluid flows through the wick structure and the space functions as a vapor channel for permitting vapor to flow therethrough. The space decreases the vapor pressure drop in the ultra-thin heat pipe and improves thermal performance.

Figure 2:
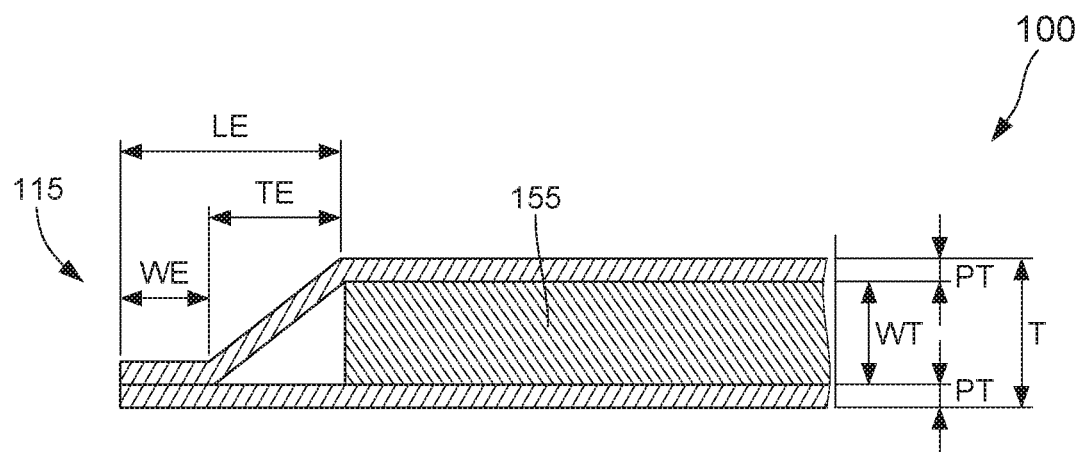
FIG. 2 is a cross-sectional view of the ultra-thin heat pipe along lines W-W and L-L, according to embodiments.

FIG. 2 is a cross-sectional view of the ultra-thin heat pipe 100 along lines W-W and L-L, according to embodiments.

The thickness T of the ultra-thin heat pipe 100 is less than around 1 mm. In some other embodiments, the thickness T of the ultra-thin heat pipe 100 is around 1 mm. A thickness PT of the first plate 110, the second plate 190, the first sidewall 111, and the second sidewall 191 of the ultra-thin heat pipe 100 is less than around 0.3 mm. A thickness WT of the wick structures is less than 0.4 mm. However, the thickness PT and wick thickness WT can be increased or decreased depending upon application and design requirements, as long as the capillary force generated in the wick structures is equal to or greater than the liquid pressure drop in the wick structures and vapor pressure drop in the ultra-thin heat pipe.

In some embodiments, and as illustrated, the closing end 115 (and working section end 195, similarly) include a weld portion WE and transitional portion TE. The weld portion WE includes the first plate 110 and the second plate 190 coupled to each other such that the ultra-thin heat pipe is vacuum sealed. The length LE of the closing end 115 (and working section end 195) are less than about 2 mm and the lengths WE of the weld portion WE and transitional portion TE are around 1.25 mm and 0.75 mm, respectively. However, in other embodiments, the length LE of the closing end 115 (and working section end 195) can be around 2 mm, depending on application and size (dimensions) of the ultra-thin heat pipe, as long as the weld portion WE vacuum seals the ultra-thin heat pipe and the transitional portion TE does not deform or crimp the wick structures.

Figure 3:
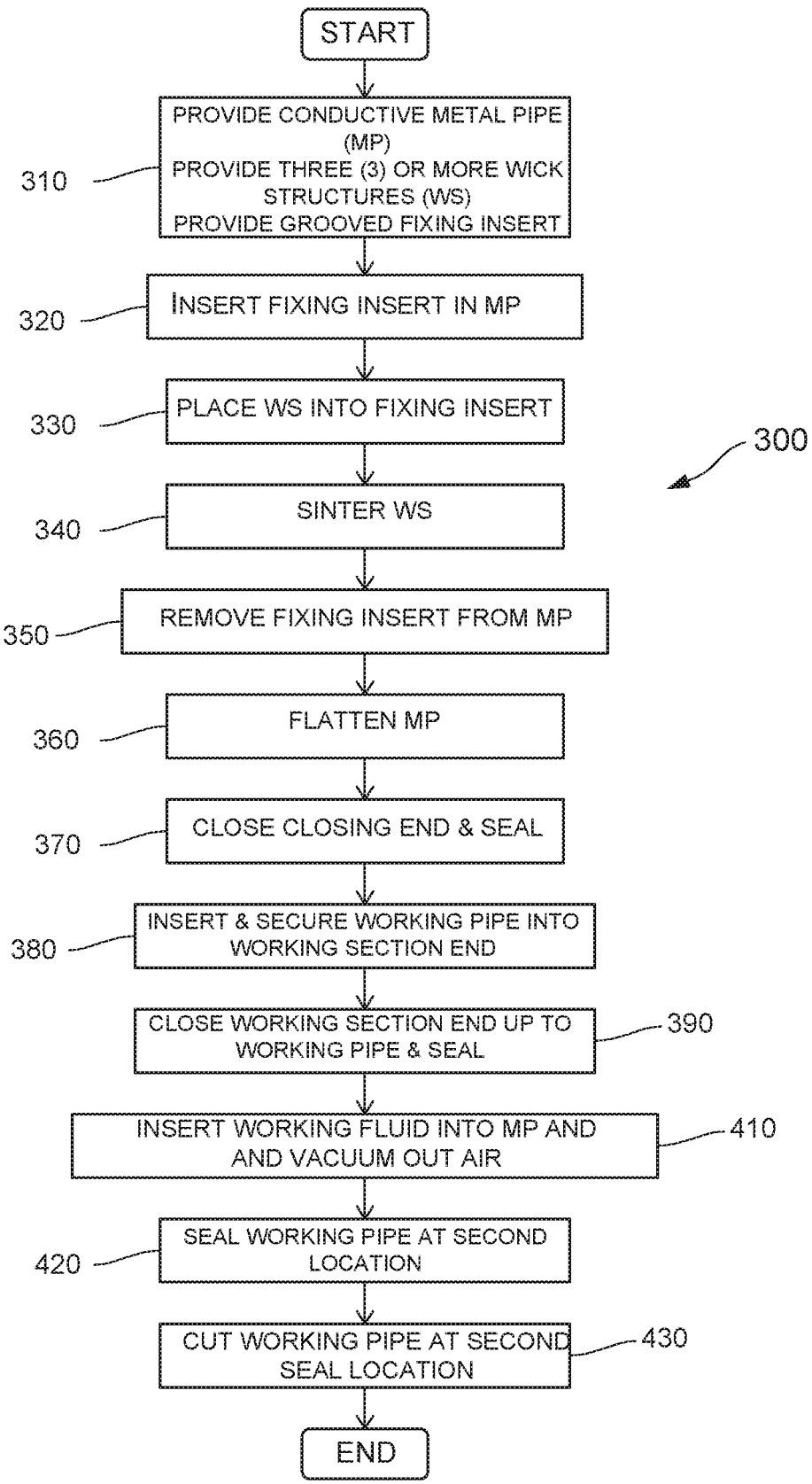
FIG. 3 is a flow chart of a method of manufacturing the ultra-thin heat pipe of FIGS. 1A-1D, according to embodiments.
Figure 4:
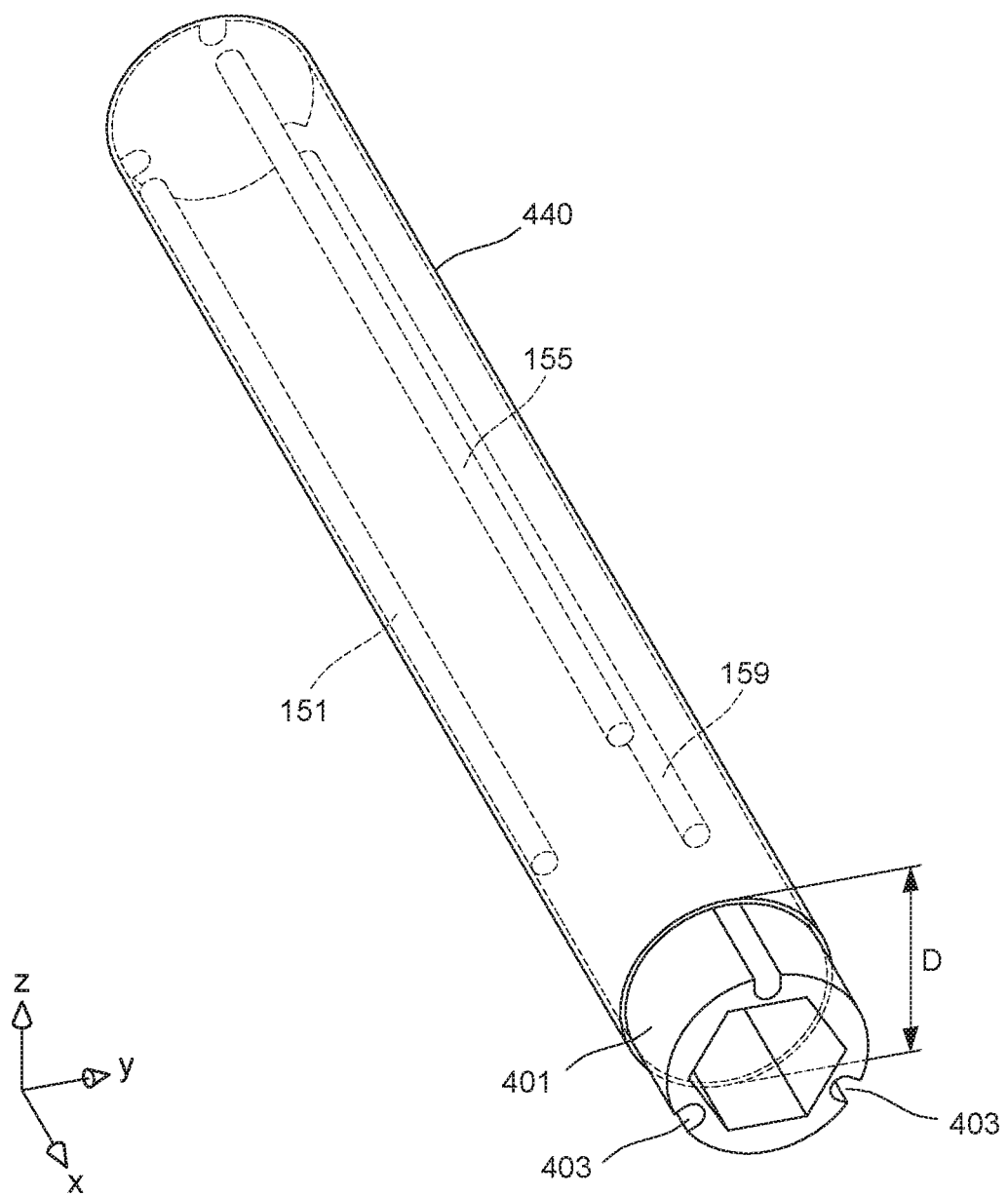
FIG. 4 is a perspective view of a conductive metal pipe following a series of operations of the method of FIG. 3, according to embodiments.

FIG. 3 is a flow chart of a method 300 of manufacturing the ultra-thin heat pipe 100, according to embodiments. It is understood that additional operations can be provided before, during, and after processes discussed in FIG. 3, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously. FIG. 4 is a perspective view of a conductive metal pipe 440 following operation 310 to operation 350 of the method 300, according to embodiments.

Referring to FIGS. 3 and 4, with continued reference to FIGS. 1A-1D, in operation 310, a conductive metal pipe 440, the first wick structure 151, the second wick structure 155, and a third wick structure 159, and a grooved fixing insert 401 are provided. In other embodiments, more than three wick structures are provided. In some embodiments, the conductive metal pipe 440 is a copper pipe, and the wick structures 151, 155, and 159 are fiber wick structures.

In operation 320, the grooved fixing insert 401 is first inserted into the conductive metal pipe 440. As illustrated, the grooved fixing insert 401 is axially (X direction) longer than the metal pipe 440 and a portion thereof protrudes from the metal pipe 440. The longer length facilitates easy insertion and removal of the grooved fixing insert 401. In operation 330, the first wick structure 151, the second wick structure 155, and the third wick structure 159 are inserted into the grooves 403 of the grooved fixing insert 401. The grooves 403 are positioned such that, when the conductive metal pipe 440 is flattened (operation 360) to form the ultra-thin heat pipe 100, the first wick structure 151, the second wick structure 155, and the third wick structure 159 are longitudinally disposed in the ultra-thin heat pipe 100 and the second wick structure 155 is located between the first wick structure 151 and the third wick structure 159 and is spaced (separated) from the first wick structure 151 and the third wick structure 159. Additionally, when the conductive metal pipe 440 is flattened, the first wick structure 151 contacts the first inner surface 119 (FIG. 1D), the second inner surface 199 (FIG. 1D), and the first sidewall inner surface 113, and the second wick structure 159 contacts the first inner surface 119 (FIG. 1D), the second inner surface 199 (FIG. 1D), and second sidewall inner surface 193. In some embodiments, the second wick structure 155 is centrally located in the ultra-thin heat pipe 100. In other embodiments, the second wick structure 155 is located offset from the center in the ultra-thin heat pipe 100.

In operation 340, the first wick structure 151, the second wick structure 155, and the third wick structure 159 are sintered to the inner surface of the conductive metal pipe 440 (e.g., the first inner surface 119 and the second inner surface 199 when flattened). The structure is then inspected to ensure proper sintering so that thermal performance of the wick structures is not affected.

The metal pipe 440 is then cooled. After cooling, in operation 350, the grooved fixing insert 401 is removed from the conductive metal pipe 440. In some embodiments, the metal pipe includes more than three wick structures. In such embodiments, the grooved fixing insert 401 includes more than three grooves 403 corresponding to the number of wick structures. The wick structures are in sintered contact with one or more of the first inner surface 119 and the second inner surface 199. At least one wick structure is positioned longitudinally and separated from the first and second sidewall inner surfaces. In some embodiments, the at least one wick structure is centrally located. However, in other embodiments, the at least one wick structure is positioned offset from the center and separated from the first and second sidewall inner surfaces. The at least one wick structure reduces deformation (e.g., collapse) of the ultra-thin heat pipe. At least two wick structures are positioned longitudinally and in contact with the first sidewall inner surface 113 and the second sidewall inner surface 193. This arrangement improves thermal performance of the ultra-thin heat pipe by generating a capillary force in the wick structures that is are equal to or greater than the liquid pressure drop in the wick structures and vapor pressure drop.

The first wick structure 151, the second wick structure 155, and the third wick structure 159 are positioned within the conductive metal pipe 440 such that longitudinal ends of the first wick structure 151, the second wick structure 155, and the third wick structure 159 are not located in the closing end 115 and the working section end 195 longitudinally opposite the closing end 115. As a result, the weld ends WE can be formed by coupling (e.g., welding) the plates of the ultra-thin heat pipe to vacuum seal the ultra-thin heat pipe and the transitional ends TE do not deform or crimp the wick structures. As illustrated, the longitudinal ends of the first wick structure 151, the second wick structure 155, and the third wick structure 159 are spaced from the adjacent longitudinal ends of the pipe 440 by the corresponding closing end 115 and working end 195.

Figure 5:
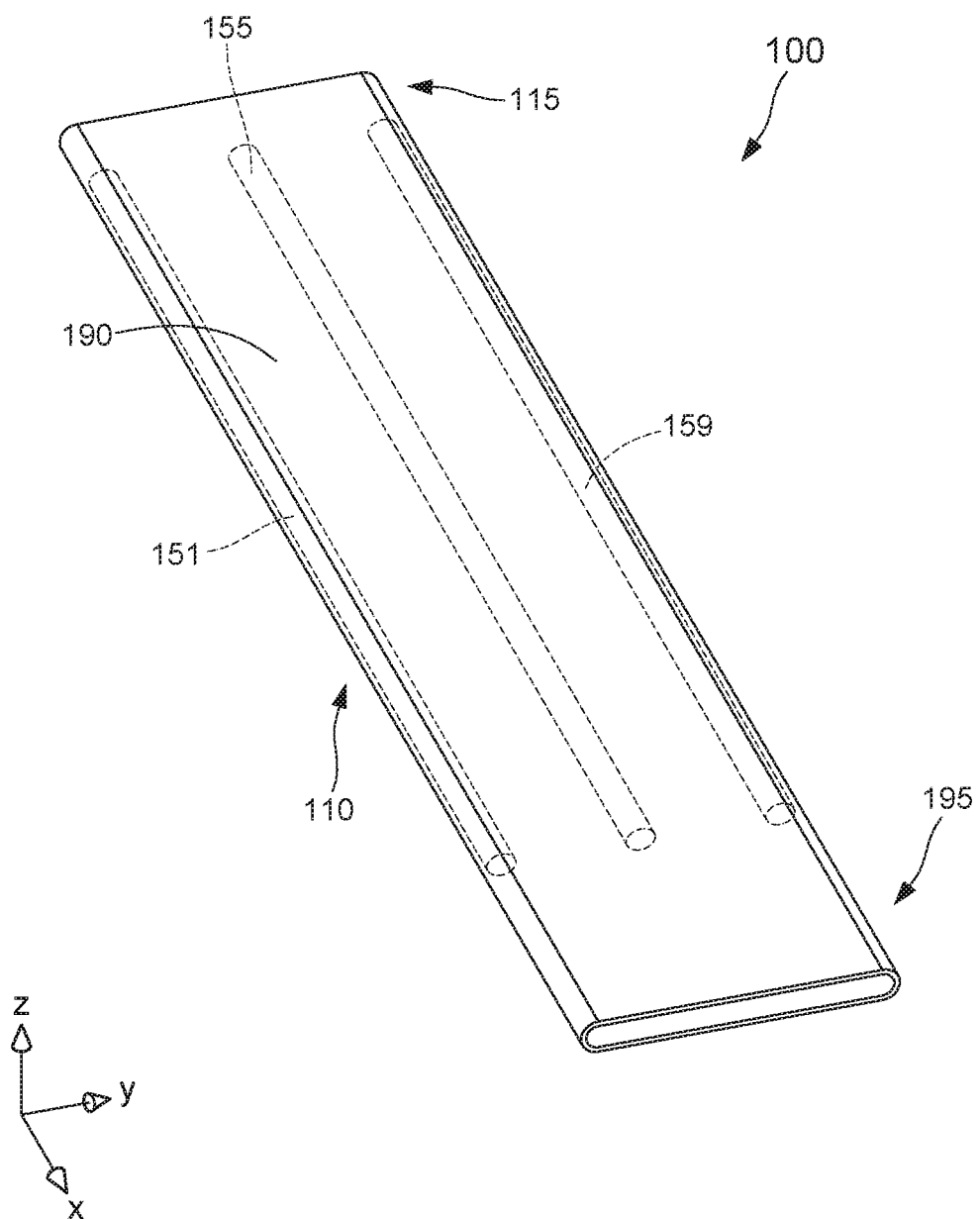
FIG. 5 is a perspective view of the ultra-thin heat pipe of FIGS. 1A-1D obtained after a flattening operation performed in the manufacturing method, according to embodiments.
Figure 6:
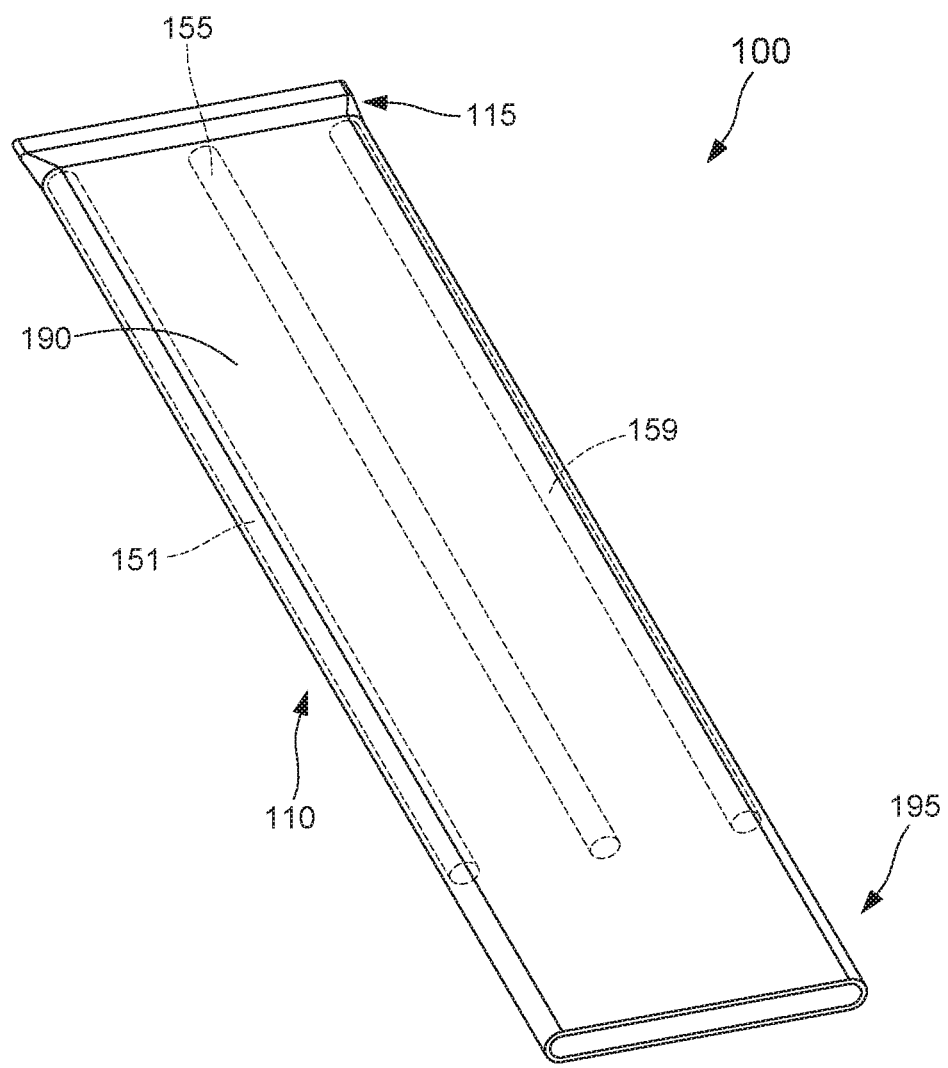
FIG. 6 is a perspective view of the ultra-thin heat pipe of FIGS. 1A-1D after an operation of the manufacturing method, according to embodiments.

FIG. 5 is a perspective view of the ultra-thin heat pipe 100 obtained after a flattening operation performed in operation 360 of the manufacturing method 300, according to embodiments. FIG. 6 is a perspective view of the ultra-thin heat pipe 100 after operation 370 of the manufacturing method 300, according to embodiments. In an embodiment, and as illustrated in FIGS. 5 and 6, in operation 360, the conductive metal pipe 440 is flattened to a thickness (Z direction) less than about 30% of the original diameter. In other embodiments, the conductive metal pipe 440 is flattened to a thickness (Z direction) less than about 20% of the original diameter. In still other embodiments, the conductive metal pipe 440 is flattened to a thickness (Z direction) less than about 10% of the original diameter. In yet other embodiments, the conductive metal pipe 440 is flattened to a thickness (Z direction) less than about 50% of the original diameter. It should be noted that the thickness of the flattened conductive metal pipe 440 is not limited to a particular value and the conductive metal pipe 440 can be flattened to any desired thickness as required by application and design.

In some embodiments, the diameter D of the conductive metal pipe 440 is around 6 mm, and the conductive metal pipe 440 is flattened to around 1 mm thickness, around 17% of its original diameter. However, the original diameter D of the conductive metal pipe can be greater or less than 6 mm, as long as the conductive metal pipe is flattened to less than 30% of the original diameter, and the formed ultra-thin heat pipe provides a capillary force that is equal to or greater than the liquid pressure drop in the wick and vapor pressure drop in the heat pipe.

In operation 370, and shown in FIG. 6, the closing end 115 of the ultra-thin heat pipe 100 (obtained from flattening the conductive metal pipe 440) is closed and sealed. In some embodiments, the closing end 115 is closed and sealed by further flattening and contacting the first plate 110 and the second plate 190 in the weld portion WE (FIG. 2) of the ultra-thin heat pipe 100 and then welding the first plate 110 and the second plate 190 in the weld portion WE. The weld portion WE and transitional portion TE are sized and shaped (or otherwise configured) to minimize deformation (or crimping) of the wick structures 151, 155, and 159. It is thus understood that the first plate 110, the second plate 190, the first sidewall 111, and the second sidewall 191 are portions of a unitary structure, i.e., the conductive metal pipe 440.

Figure 7:
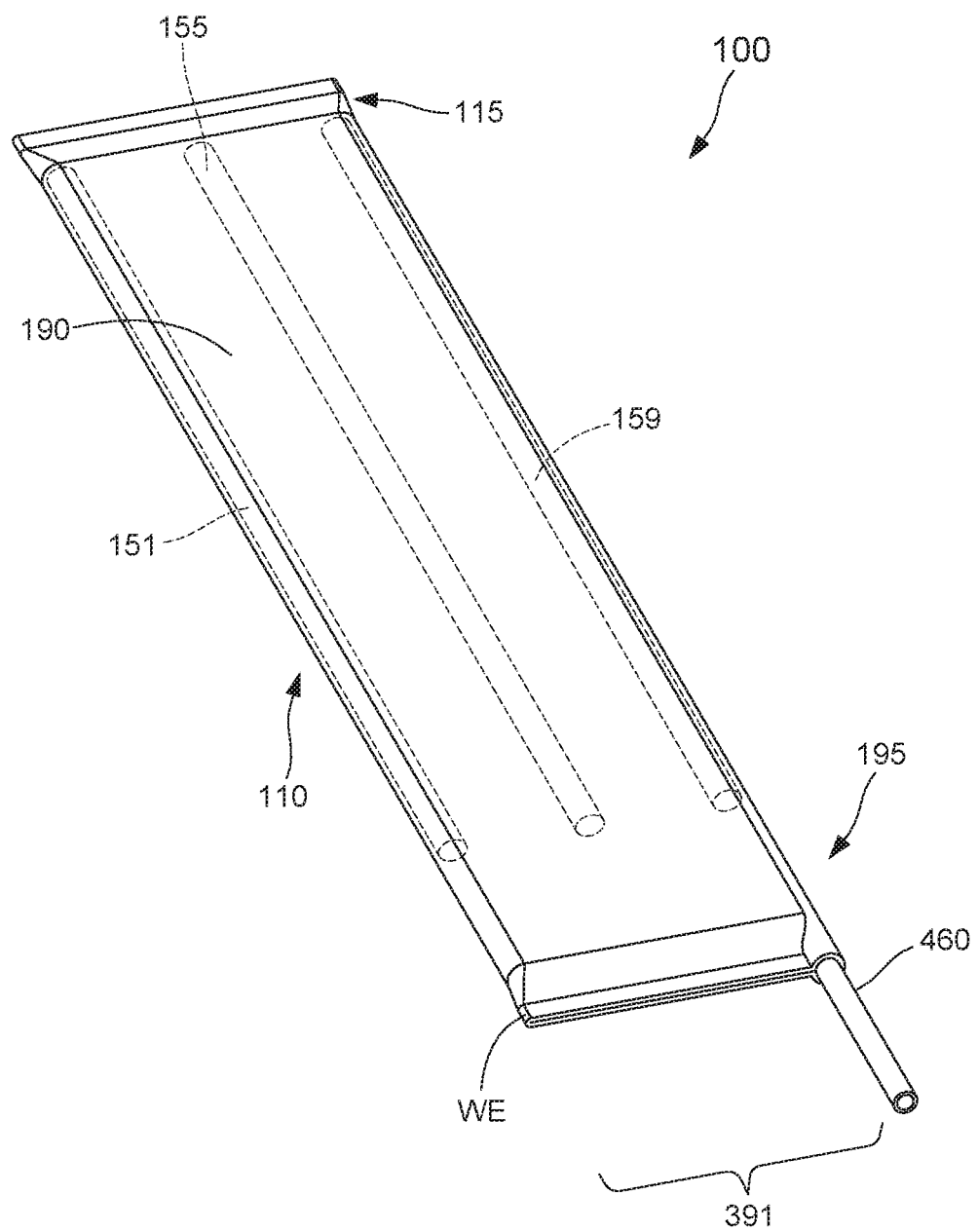
FIG. 7 is a perspective view of the ultra-thin heat pipe of FIGS. 1A-1D following a series of operations of the manufacturing method, according to embodiments.

FIG. 7 is a perspective view of the ultra-thin heat pipe 100 following operations 380 to 410 of the manufacturing method 300, according to embodiments. Referring to FIG. 7, with continued reference to FIGS. 1A to 6, in operation 380, a working pipe 460 is partially inserted into the ultra-thin heat pipe 100 from the working section end 195 and secured therein. The working pipe 460 contacts the first inner surface 119, the second inner surface 199, and the second sidewall inner surface 193 of ultra-thin heat pipe 100.

In operation 390, the first plate 110 and the second plate 190 in the weld portion WE (also refer FIG. 2) of the working section end 195 flattened and contacted against each other to seal the end 391 of the ultra-thin heat pipe 100. In some embodiments, and as illustrated, the ultra-thin heat pipe 100 is sealed, e.g., by welding the first plate 110 and the second plate 190 up to the working pipe 460. When sealed, the internal space 101 of the ultra-thin heat pipe 100 can be accessed only through the working pipe 460. Next, in operation 410, a working fluid is introduced into the ultra-thin heat pipe 100 through the working pipe 460 and then air is vacuumed out of the ultra-thin heat pipe 100.

In some embodiments, the working fluid includes deionized water, methanol or acetone. Other working fluid can be also used as long as the working fluid can be vaporized by a heat source and the vapor can condense back into the working fluid and be drawn to the fiber wick structure to flow back to the heat source.

Figure 8:
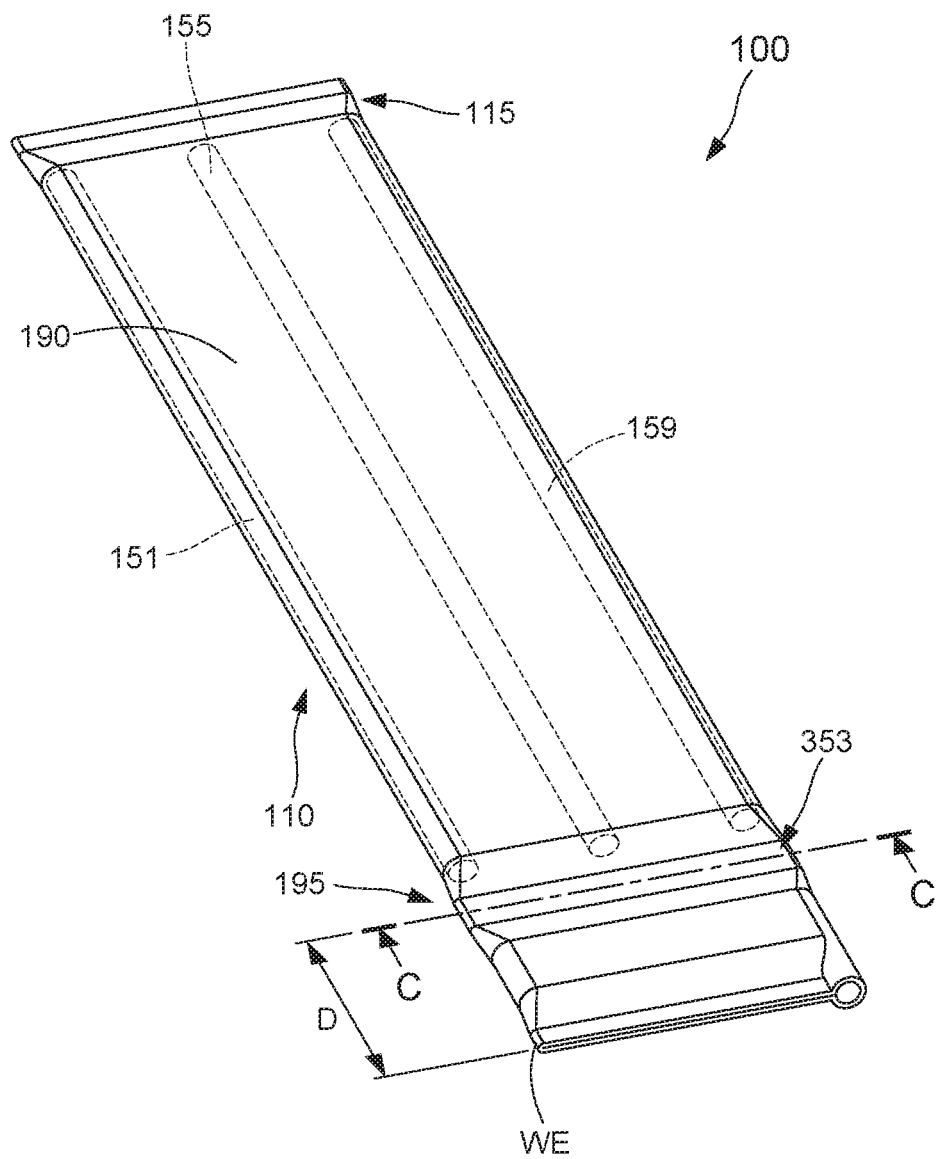
FIG. 8 is a perspective view of the ultra-thin heat pipe of FIGS. 1A-1D following a series of operations of the manufacturing method, according to embodiments.

FIG. 8 is a perspective view of the ultra-thin heat pipe 100 following operations 420 and (430) of the manufacturing method 300, according to embodiments.

Referring to FIG. 8, with continued reference to FIGS. 1A to 7, in operation 420, the first plate 110 and the second plate 190 are contacted with each other a distance D from the end 391, and the ultra-thin heat pipe 100 is sealed at a second seal location 353, e.g., by welding the first plate 110 and the second plate 190 to each other. Contacting the first plate 110 and the second plate 190 at the second seal location 353 also results in another weld portion WE and transitional portion TE, similar to the weld portion WE and the transitional portion TE obtained at end 391. The weld portion WE and the transitional portion TE at the second seal location 353 also are sized and shaped (or otherwise configured) to minimize deformation (or crimping) of the wick structures 151, 155, and 159. It should be noted that the working pipe 460 is not present at the location of the second seal and the entire width (Y direction) of the ultra-thin heat pipe 100 is sealed at the second seal location 353.

After cooling, the working pipe 460 is removed. In operation 430, the ultra-thin heat pipe 100 is cut (e.g., along the line C-C) at the second seal location 353.

In embodiments, welding method as known by those skilled in the relevant art, such as ultrasonic welding, diffusion welding, or laser welding, can be used, as long as a vacuum seal can be obtained and the further flattening and then welding of the weld portion WE and the transitional portion TE minimize deformation and crimping of the wick structures. In other embodiments, a heat treatment processes (and other suitable processing techniques) can be used in the manufacturing method 300 of the ultra-thin heat pipe.

In the manufacturing method 300, according to embodiments discussed above, the closing end 115 and working section end 195 are contacted and welded in a manner that minimizes deformation or crimping of the first wick structure 151, the second wick structure 155, and the third wick structure 159 (or more specifically, of the ends of the wick structures). Accordingly, adverse thermal performance effects of crimped wick structures are minimized and the cutting of the closing end 115 and working section end 195 reduce the length of the planar heat pipes, thereby resulting in a space saving permitting usage of the ultra-thin heat pipe in space constrained designs.

Figure 9:
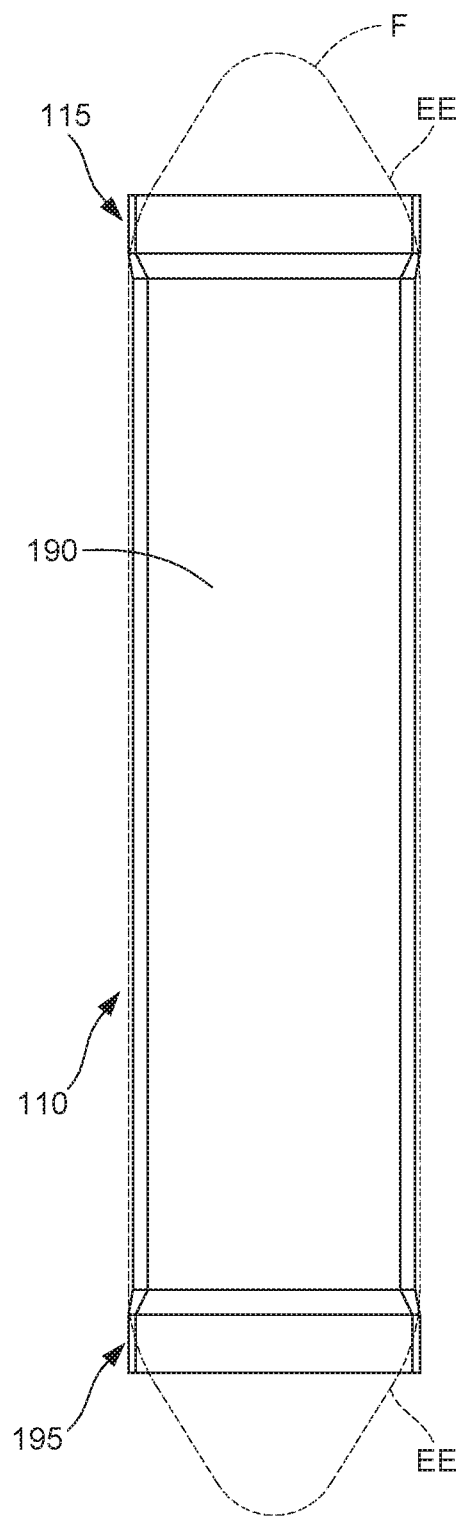
FIG. 9 illustrates a comparison between the ultra-thin heat pipe of FIGS. 1A-1D manufactured according to the embodiments disclosed herein and an outline of an ultra-thin heat pipe manufactured according to existing manufacturing methods.

FIG. 9 illustrates a comparison between the ultra-thin heat pipe 100 manufactured according to the embodiments disclosed herein and an outline of an ultra-thin heat pipe manufactured according to existing manufacturing methods, as indicated by the dashed line F. As shown, the ultra-thin heat pipe manufactured using existing methods has generally conically shaped extended ends EE that extend beyond the ultra-thin heat pipe 100. The increased length of the ends hinders manufacture of ultra-thin heat pipe having greater widths since as the width of the ultra-thin heat pipe increases, the conical ends of the ultra-thin heat pipe become more longer. In contrast, the ultra-thin heat pipe 100, manufactured according to embodiments disclosed herein, is relatively shorter in length and does not include conically shaped extended ends.

In some embodiments, the ultra-thin heat pipe can be fastened to a processing unit (or any heat generating device) by any suitable fastening method such as soldering, brazing or using thermal paste combined with glue. Alternatively, other fastening methods can be used for ensuring direct thermal contact between the free surface of the processing unit (or heat generating device) and the ultra-thin heat pipe.

Figures 10A, 10B, 10C, 10D, 10E:
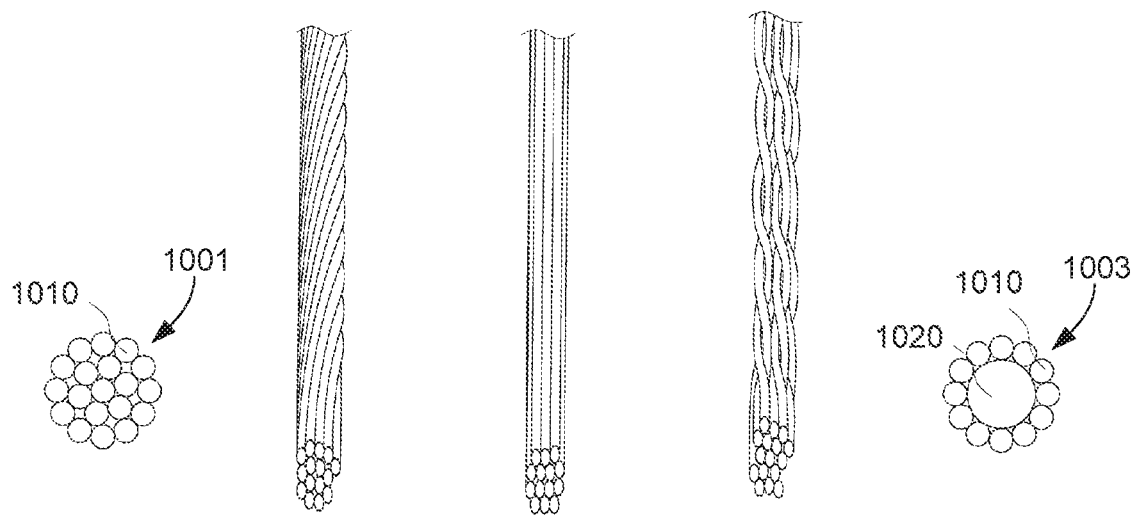
FIG. 10A is a cross-sectional view of a wick structure including a plurality of wick fibers arranged in a circular manner.
FIGS. 10B-10D illustrate different configurations of the wick structures of FIG. 10A.
FIG. 10E is a cross-sectional view of a wick structure including multiple wick fibers arranged around a central wick fiber.

FIG. 10A is a cross-sectional view of a wick structure 1001 including a plurality of wick fibers 1010 arranged in a circular manner. The wick structure 1001 may be similar in some respects to the first wick structure 151, the second wick structure 155, and the third wick structure 159 according to embodiments disclosed herein. In some embodiment, the wick fibers 1010 include copper. However, the wick fibers 1010 can include other materials that facilitate the flow of condensed fluid by capillary force through the wick structure 1001 formed using the wick fibers 1010. As illustrated, the wick fibers 1010 are of a same size and packed in concentric layers. However, in other embodiments, the number of concentric layers can be increased or decreased. Further, in other embodiments and as required by application and design requirements, the individual wick fibers 1010 can be packed in other non-circular arrangements and the individual wick fibers 1010 can have different sizes, as long as the wick structures can facilitate the flow of condensed fluid by capillary force from the condenser section back to the evaporator section of the ultra-thin heat pipe and a capillary force generated in the wick structures is equal to or greater than the liquid pressure drop in the wick structure and vapor pressure drop in the ultra-thin heat pipe.

FIG. 10B illustrates the wick structure 1001 in which the plurality of wick fibers 1010 are loosely twisted together. FIG. 10C illustrates the wick structure 1001 in which the plurality of wick fibers 1010 are longitudinally arranged without any twist. FIG. 10D illustrates the wick structure 1001 in which the plurality of wick fibers 1010 are twisted together or in pairs to form a braided structure.

FIG. 10E is a cross-sectional view of a wick structure 1003 including multiple wick fibers 1010 arranged around a central wick fiber 1020. The wick structure 1003 may be similar in some respects to the first wick structure 151, the second wick structure 155, and the third wick structure 159 according to embodiments disclosed herein. In some embodiments, the wick fibers 1010 and 1020 include copper. However, the wick fibers 1010 and/or 1020 can include other materials that facilitate the flow of condensed fluid by capillary force through the wick structure 1003 formed using the wick fibers 1010 and 1020.

Figures 10F, 10G, 10H, 10J, 10K:
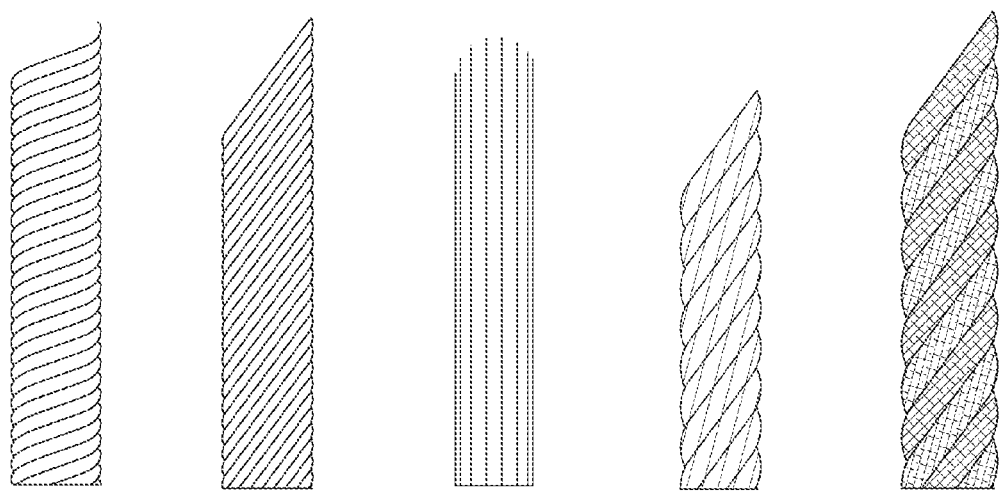
FIGS. 10F, 10G, 10H, 10J, and 10K illustrate different configurations of the wick structures of FIG. 10E.

FIGS. 10F, 10G, 10H, 10J, and 10K illustrate the wick structures 1003 including different arrangements of the wick fibers 1010 around the central wick fiber 1020. In FIGS. 10F and 10G, the wick structure 1003 is formed by twisting the wick fibers 1010 in the shape of a helix to form a bundle. The wick fibers 1010 in FIG. 10F are relatively tightly twisted compared to the wick fibers 1010 in FIG. 10G. The more tightly twisted structure forms shorter distances for the working fluid to travel versus the more loosely twisted structures. In FIG. 10H, the wick structure 1003 includes the wick fibers 1010 longitudinally extending and arranged side by side. In FIG. 10J, the wick structure 1003 includes the wick fibers 1010 individually twisted and then twisted together in the shape of a helix to form a bundle. In FIG. 10K, the wick structure 1003 includes the wick fibers 1010 twisted together in the shape of a helix to form a structure similar to a braided rope.

In some other embodiments, the central wick fiber 1020 is absent in the wick structures 1003. In some other embodiments, the wick fibers 1010, 1020, and/or 1030 are flattened. The shape of the wick structures 1001 and 1003 is not limited to any particular shape. In some embodiments, the wick structures may be in a zig-zag shape or any other desired shape.

Figure 11:
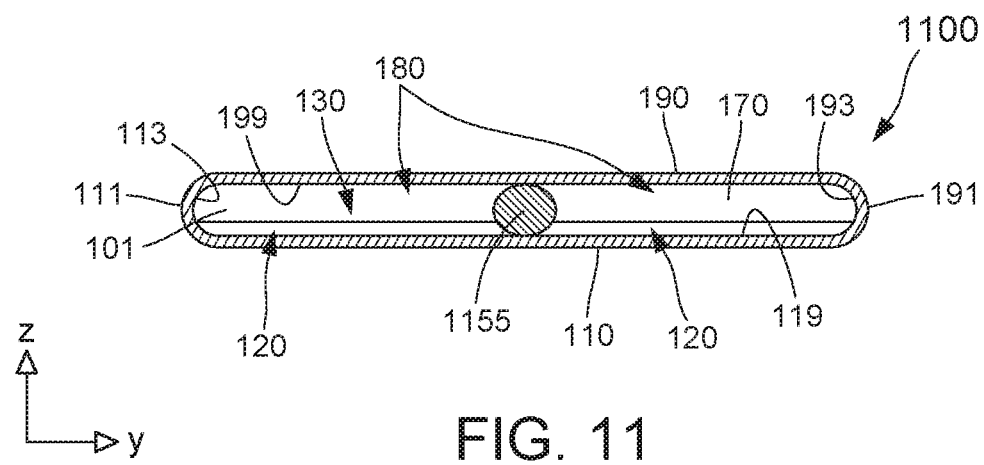
FIG. 11 is a cross-sectional view of an ultra-thin heat pipe, according to embodiments.

FIG. 11 is a cross-sectional view of an ultra-thin heat pipe 1100, according to embodiments. The ultra-thin heat pipe 1100 may be similar in some respects to the ultra-thin heat pipe 100 in FIGS. 1A-1D, and therefore may be best understood with reference thereto where like numerals designate like components not described again in detail. As shown in FIG. 11, the ultra-thin heat pipe 1100 includes a central wick structure 1155 longitudinally disposed in the internal space 101 and that contacts the first and second inner surfaces 119 and 199, and divides (or otherwise separates) the internal space 101 into the first vapor flow channel 130 and the second vapor flow channel 170. The central wick structure 1155 is similar to the first wick structure 151, the second wick structure 155, or the third wick structure 159 discussed above. The central wick structure 1155 supports the first and second plates 110 and 190 of the ultra-thin heat pipe 1100 and minimize deformation of the ultra-thin heat pipe 1100. In some embodiments, the capillary force generated in the central wick structure 1155 is equal to or greater than the liquid pressure drop in the wick structure 1155 and vapor pressure drop in the ultra-thin heat pipe 1100.

Figure 12:
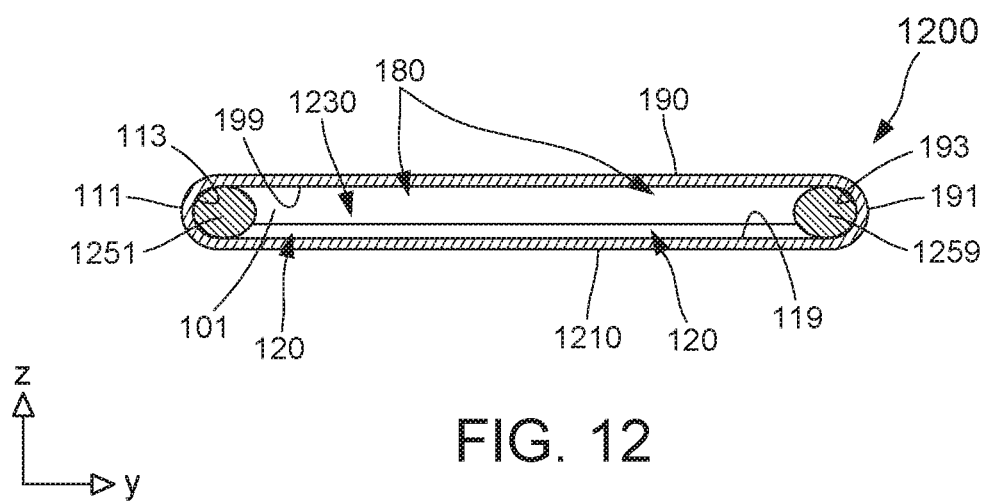
FIG. 12 is a cross-sectional view of an ultra-thin heat pipe, according to embodiments.

FIG. 12 is a cross-sectional view of an ultra-thin heat pipe 1200, according to embodiments. The ultra-thin heat pipe 1200 may be similar in some respects to the ultra-thin heat pipe 100 in FIGS. 1A-1D, and therefore may be best understood with reference thereto where like numerals designate like components not described again in detail. As shown in FIG. 12, the ultra-thin heat pipe 1200 includes first and second wick structures 1251 and 1259 longitudinally disposed in the internal space 101. The first wick structure 1251 longitudinally contacts the first inner surface 119, the second inner surface 199, and the first sidewall inner surface 113 of the first sidewall 111. The second wick structure 1259 longitudinally contacts the first inner surface 119, the second inner surface 199, and the second sidewall inner surface 193. The first wick structure 1251 and the second wick structure 1259 at least partially define a central vapor flow channel 1230 in the internal space 101. The first wick structure 1251 and the second wick structure 1259 support the first and second plates 110 and 190 of the ultra-thin heat pipe 1200 and minimize deformation of the ultra-thin heat pipe 1100. In some embodiments, thicknesses T of the ultra-thin heat pipe 1200 is greater than around 1 mm and thicknesses PT greater than around 0.3 mm. The capillary force generated in the first and second wick structures 1251 and 1259 is equal to or greater than the liquid pressure drop in the wick structures and vapor pressure drop in the ultra-thin heat pipe 1200.

Figure 13:
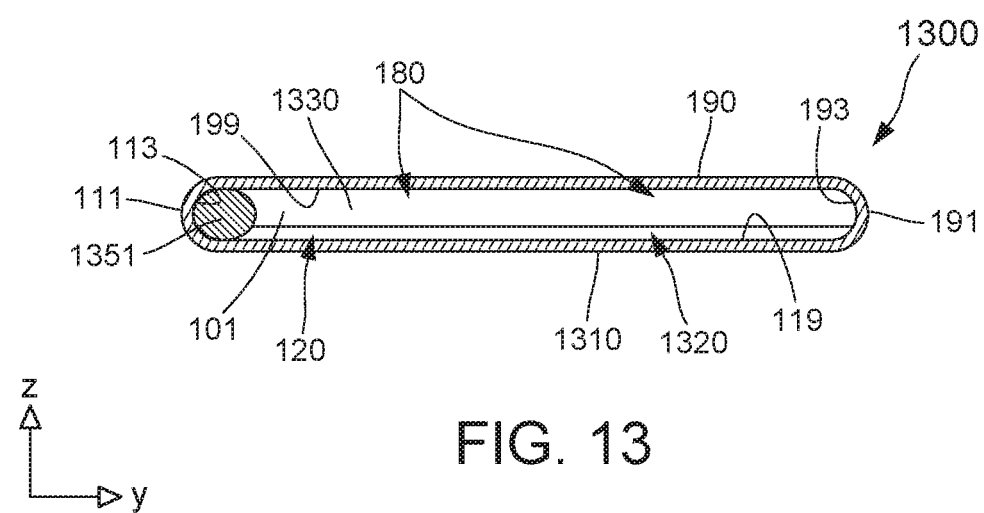
FIG. 13 is a cross-sectional view of an ultra-thin heat pipe, according to embodiments.

FIG. 13 is a cross-sectional view of an ultra-thin heat pipe 1300, according to embodiments. The ultra-thin heat pipe 1300 may be similar in some respects to the ultra-thin heat pipe 100 in FIGS. 1A-1D and ultra-thin heat pipe 1200 in FIG. 12, and therefore may be best understood with reference thereto where like numerals designate like components not described again in detail. As shown in FIG. 13, the ultra-thin heat pipe 1300 includes a single wick structure 1351 longitudinally disposed in the internal space 101. The first wick structure 1351 longitudinally contacts the first inner surface 119, the second inner surface 199, and the first sidewall inner surface 113 of the first sidewall 111. The wick structure 1351 at least partially defines a vapor flow channel 1330 in the internal space 101. The wick structure 1351 supports the first and second plates 110 and 190 of the ultra-thin heat pipe 1300 and minimizes deformation of the ultra-thin heat pipe 1300. In some embodiments, the thicknesses T of the ultra-thin heat pipe 1300 is greater than around 1 mm and thicknesses PT is greater than around 0.3 mm. The capillary force generated in the wick structure 1351 is equal to or greater than the liquid pressure drop in the wick structure 1351 and vapor pressure drop in the ultra-thin heat pipe 1300.

Figure 14:
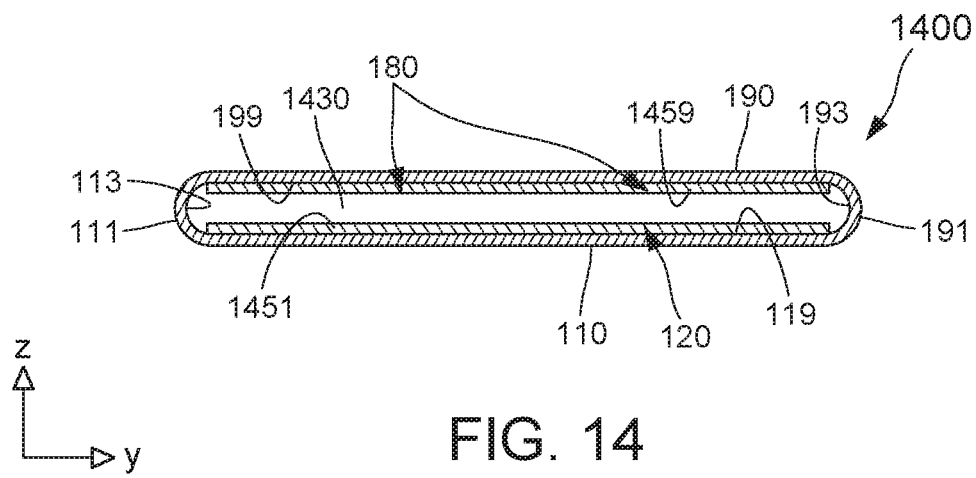
FIG. 14 is a cross-sectional view of an ultra-thin heat pipe, according to embodiments.

FIG. 14 is a cross-sectional view of an ultra-thin heat pipe 1400, according to embodiments. The ultra-thin heat pipe 1400 may be similar in some respects to the ultra-thin heat pipe 100 in FIGS. 1A-1D, and therefore may be best understood with reference thereto where like numerals designate like components not described again in detail. As shown in FIG. 14, the ultra-thin heat pipe 1400 includes a first wick structure 1451 and a second wick structure 1459 disposed extending longitudinally between the evaporator section 120 and the condenser section 180. The first wick structure 1451 longitudinally contacts a first inner surface 119 and is spaced (separated) from the first sidewall inner surface 113 of the first sidewall 111 and the second sidewall inner surface 193 of the sidewall 191. The second wick structure 1459 longitudinally contacts a second inner surface 199 and is spaced (separated) from the first sidewall inner surface 113 of the first sidewall 111 and the second sidewall inner surface 193 of the sidewall 191. As illustrated in FIG. 14, the first wick structure 1451 does not contact the second inner surface 199 and the second wick structure 1459 does not contact the first inner surface 119. The internal space 101 defines a central vapor flow channel 1430 between the sidewalls 111 and 191. The first wick structure 1451 and the second wick structure 1459 are depicted as plate shaped wick structures. However, the shape of the first wick structure 1451 and the second wick structure 1459 is not limited to any particular shape and the first wick structure 1451 and the second wick structure 1459 can have a shape as required by application and design, without departing from the scope of the disclosure.

In some embodiment, the first and second wick structures 1451 and 1459 are sintered powdered wick structures, mesh screen wick structures, or a combination thereof and are sintered to the first inner surface 119 and second inner surface 199. The widths of the wick structures 1451 and 1459 are not limited to any specific width. Any width is possible, provided the capillary force generated in the wick structures 1451 and 1459 is equal to or greater than the liquid pressure drop in the wick structures 1451 and 1459 and vapor pressure drop in the ultra-thin heat pipe 1400. In some embodiments, the height of the central vapor flow channel 1430 throughout the ultra-thin heat pipe 1400 is at least equal to, or greater than the thicknesses (Z direction) of the first and second wick structures 1451 and 1459.

Figure 15:
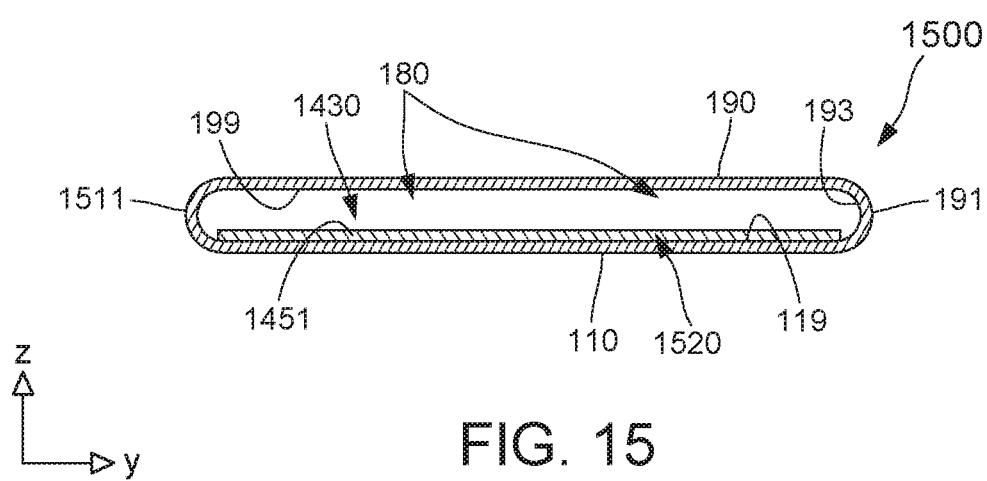
FIG. 15 is a cross-sectional view of an ultra-thin heat pipe, according to embodiments.

FIG. 15 is a cross-sectional view of an ultra-thin heat pipe 1500, according to embodiments. The ultra-thin heat pipe 1500 may be similar in some respects to the ultra-thin heat pipe 100 in FIGS. 1A-1D and the ultra-thin heat pipe 1400 in FIG. 14, and therefore may be best understood with reference thereto where like numerals designate like components not described again in detail. As shown in FIG. 15, the ultra-thin heat pipe 1500 includes a single wick structure 1451, instead of two wick structures in FIG. 14. In some embodiment, the wick structure 1451 is a sintered powdered wick structure, a mesh screen wick structure, or a combination thereof, and is sintered to the first inner surface 119 and the second inner surface 199. The widths of the wick structure 1451 is not limited to any specific width. Any width is possible, provided the capillary force generated in the wick structure 1451 is equal to or greater than the liquid pressure drop in the wick structure 1451 and vapor pressure drop in the ultra-thin heat pipe 1500.

Figure 16:
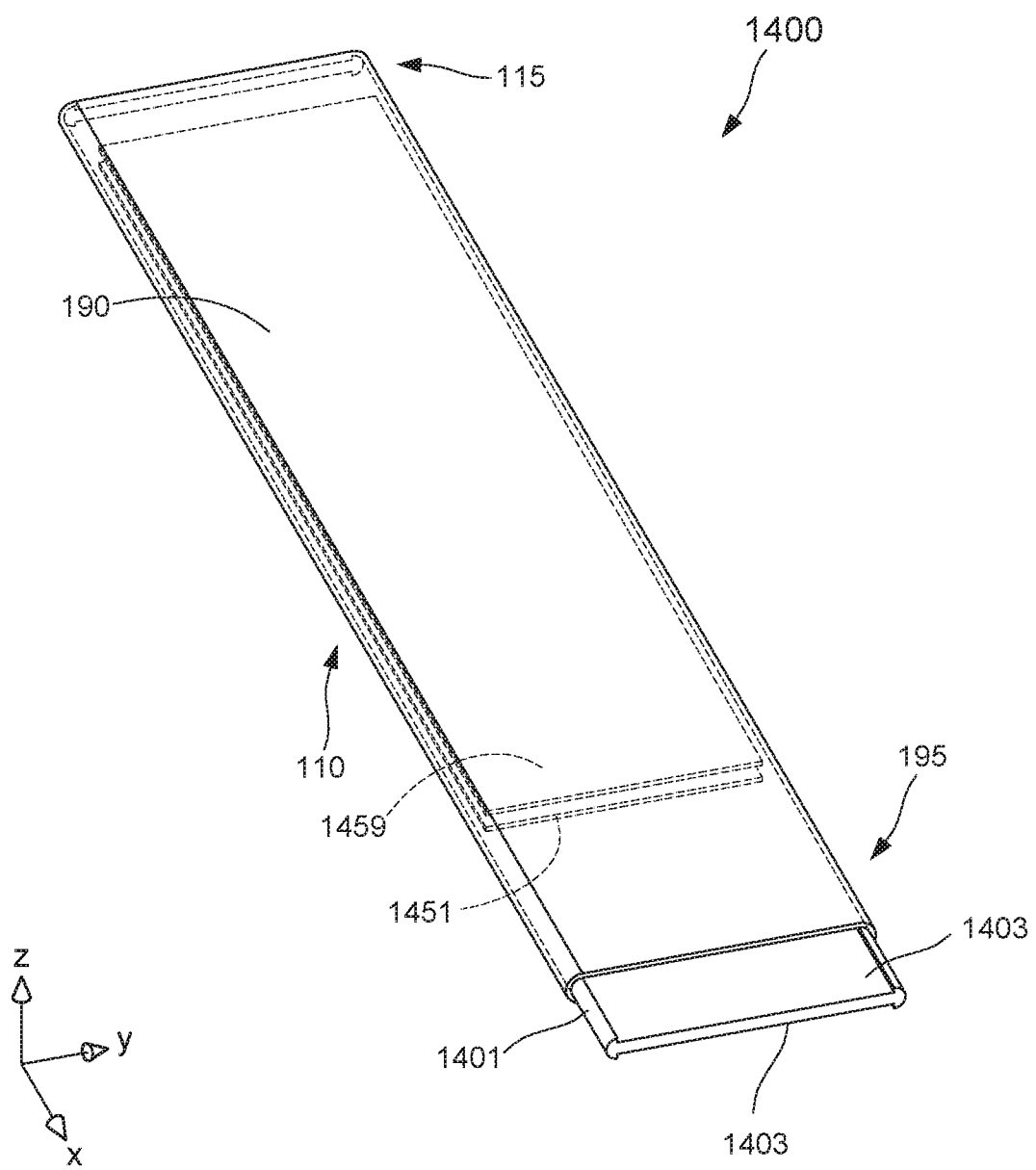
FIG. 16 illustrates a flattened conductive metal pipe including a grooved fixing insert having grooves.

The ultra-thin heat pipes 1400 and 1500 are manufactured using a method similar to the method 300 (FIG. 3) of manufacturing the ultra-thin heat pipe 100. The method will be briefly discussed with reference to FIGS. 3 and 16. For manufacturing the ultra-thin heat pipes 1400 and 1500, the conductive metal pipe 440 is first flattened to a desired thickness and a grooved fixing insert is then inserted into the flattened conductive metal pipe 440. FIG. 16 illustrates a grooved fixing insert 1401 including grooves 1403 inserted into the flattened conductive metal pipe 440. The grooves 1403 are included on top and bottom surfaces of the grooved fixing insert 1401 for forming the wick structures 1451 and 1459 (illustrated in phantom). The grooves 1403 are sized and shaped (or otherwise configured) to form plate shaped wick structures 1451 and 1459. Copper powder (or other material) for forming the wick structures 1451, 1459 is filled in the grooves 1403.

The copper powder is sintered to form the first wick structure 1451 and the second wick structure 1459 on the inner surface of the flattened conductive metal pipe 440 (e.g., the first inner surface 119 and the second inner surface 199). The structure is then inspected to ensure proper sintering so that thermal performance of the wick structures is not affected.

The metal pipe 440 is then cooled. After cooling, the grooved fixing insert 1401 is removed. The remaining operations of the method for manufacturing ultra-thin heat pipes 1400 and 1500 are similar to operation 370 onwards in FIG. 3, and a discussion thereof is omitted for the sake of brevity. The arrangement of wick structures 1451 and 1459 improves thermal performance of the ultra-thin heat pipe by generating a capillary force in the wick structures that is equal to or greater than the liquid pressure drop in the wick structures and vapor pressure drop.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heat dissipating device, comprising:
a first plate;
a second plate opposite the first plate, wherein
the first plate and the second plate are connected to each other at longitudinally opposite ends thereof,
longitudinally extending ends of the first plate and the second plate are connected to each other by sidewalls,
the first plate, the second plate and the sidewalls enclosing an internal space of the heat dissipating device,
the first plate forms a top horizontal surface of the internal space, the second plate forms a bottom horizontal surface of the internal space, and each sidewall forms side surfaces of the internal space;
a first wick structure disposed in the internal space, wherein
the first wick structure extends longitudinally between the longitudinally opposite ends of the first plate and the second plate,
the first wick structure at least partially defines a first vapor flow channel of the heat dissipating device,
the heat dissipating device includes an evaporator section and an condenser section located at the longitudinally opposite ends of the heat dissipating device, the first wick structure is located in the evaporator section and the condenser section and directly contacts the top horizontal surface and the bottom horizontal surface in both the evaporator section and the condenser section, the second plate extends horizontally and longitudinally to form an extended end at each longitudinally opposite end, the first plate extends longitudinally to form a transitional portion at each longitudinally opposite end that is sloped towards the second plate and connects the respective extended end of the second plate; and the first wick structure extends an entire length of the heat dissipating device and is absent in the transitional portions.

2. The heat dissipating device of claim 1, wherein the first wick structure is the only wick structure disposed in the internal space.

3. The heat dissipating device of claim 2, wherein the first wick structure is spaced from the sidewalls.

4. The heat dissipating device of claim 1, wherein the first wick structure is centrally disposed in the internal space.

5. The heat dissipating device of claim 1, wherein the first wick structure contacts a sidewall inner surface of one of the sidewalls.

6. The heat dissipating device of claim 1, further comprising a second wick structure disposed in the internal space and contacting at least one of the top horizontal surface and the bottom horizontal surface.

7. The heat dissipating device of claim 6, wherein the first wick structure and the second wick structure are disposed spaced from each other and contact sidewall inner surfaces of opposite sidewalls.

8. The heat dissipating device of claim 7, wherein the first vapor flow channel is disposed between the first wick structure and the second wick structure.

9. The heat dissipating device of claim 7, further comprising a third wick structure disposed in the internal space and contacting at least one of the top horizontal surface and the bottom horizontal surface.

10. The heat dissipating device of claim 9, wherein the third wick structure is disposed between the first and second wick structures.

11. The heat dissipating device of claim 9, wherein the first vapor flow channel is disposed between the first wick structure and the third wick structure and a second vapor flow channel is disposed between the third wick structure and the second wick structure.

12. The heat dissipating device of claim 6, wherein the first wick structure contacts the inner surface of only the first plate and the second wick structure contacts the inner surface of only the second plate.

13. The heat dissipating device of claim 12, wherein the first vapor flow channel is disposed between the first wick structure and the second wick structure.

14. The heat dissipating device of claim 6, wherein the first wick structure and the second wick structure are spaced from the sidewalls.

15. The heat dissipating device of claim 1, wherein the first plate, the second plate, and the sidewalls form a unitary structure.

* * * * *